United States Patent
Glickman et al.

(10) Patent No.: US 10,795,797 B2
(45) Date of Patent: Oct. 6, 2020

(54) CONTROLLER, SATA SYSTEM AND METHOD OF OPERATION THEREFOR

(75) Inventors: Eran Glickman, Rishon Le Zion (IL); Ron Bar, Ramat Hasharon (IL); Idan Ben Ami, Hertzelia (IL); Benny Michalovich, Ra'Anana (IL)

(73) Assignee: NXP USA, Inc., Austin, TX (US)

( * ) Notice: Subject to any disclaimer, the term of this patent is extended or adjusted under 35 U.S.C. 154(b) by 208 days.

(21) Appl. No.: 14/359,932

(22) PCT Filed: Nov. 25, 2011

(86) PCT No.: PCT/IB2011/055298
§ 371 (c)(1),
(2), (4) Date: May 22, 2014

(87) PCT Pub. No.: WO2013/076532
PCT Pub. Date: May 30, 2013

(65) Prior Publication Data
US 2014/0298111 A1    Oct. 2, 2014

(51) Int. Cl.
*G06F 11/00*    (2006.01)
*G06F 11/34*    (2006.01)
*G06F 13/38*    (2006.01)
*H03M 13/00*    (2006.01)

(52) U.S. Cl.
CPC .......... *G06F 11/349* (2013.01); *G06F 13/387* (2013.01); *H03M 13/00* (2013.01)

(58) Field of Classification Search
CPC . G06F 11/0784; G06F 11/0793; G06F 11/102
See application file for complete search history.

(56) References Cited

U.S. PATENT DOCUMENTS

| | | | | |
|---|---|---|---|---|
| 6,226,269 B1 * | 5/2001 | Brewer | ................. | H04L 49/555 370/245 |
| 6,380,873 B1 * | 4/2002 | Priborsky | ........... | H03M 7/3084 235/431 |
| 7,047,335 B2 * | 5/2006 | Schauer | ................ | G06F 13/385 710/105 |
| 7,404,013 B1 * | 7/2008 | Masiewicz | ............ | G06F 3/0607 710/17 |
| 7,619,984 B2 * | 11/2009 | Carmichael | ............... | H04L 1/08 370/252 |
| 7,634,692 B2 * | 12/2009 | Liu | ..................... | G06F 11/1004 714/49 |
| 7,865,803 B2 * | 1/2011 | Liu | ..................... | G06F 11/0727 714/52 |
| 2001/0002901 A1 * | 6/2001 | Henson | ..................... | H04L 1/00 370/242 |

(Continued)

OTHER PUBLICATIONS

International Search Report and Written Opinion Correlating to PCT/IB2011/055298 dated Aug. 14, 2012.

*Primary Examiner* — Jonathan D Gibson

(57) ABSTRACT

A controller for operably coupling a drive unit to a host unit in a serial advanced technology attachment (SATA) system is described. The controller comprises a hardware processor arranged to: receive a plurality of SATA data frames; identify a first primitive sequence in at least one of the plurality of SATA data frames that adversely affects a performance of the SATA system; and replace the identified first primitive sequence with a second primitive sequence in response thereto.

20 Claims, 5 Drawing Sheets

(56) References Cited

U.S. PATENT DOCUMENTS

| | | | |
|---|---|---|---|
| 2005/0246605 A1* | 11/2005 | Tseng | G06F 13/387 |
| | | | 714/746 |
| 2006/0149878 A1* | 7/2006 | Carmichael | G06F 13/24 |
| | | | 710/263 |
| 2007/0206496 A1 | 9/2007 | Roy et al. | |
| 2007/0260965 A1 | 11/2007 | Schmidt et al. | |
| 2008/0256402 A1 | 10/2008 | Tseng et al. | |
| 2010/0050018 A1 | 2/2010 | Liu et al. | |
| 2014/0298111 A1* | 10/2014 | Glickman | G06F 11/349 |
| | | | 714/47.2 |

\* cited by examiner

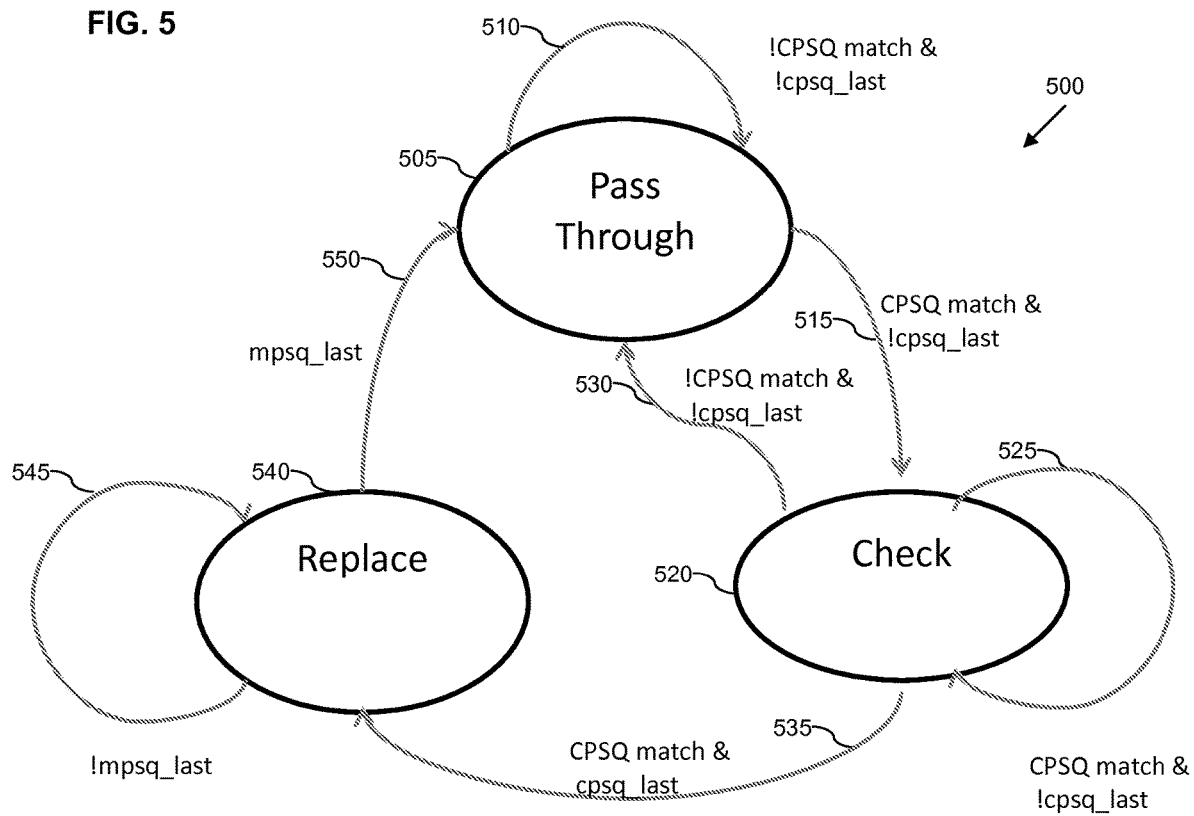

CONTROLLER, SATA SYSTEM AND METHOD OF OPERATION THEREFOR

FIELD OF THE INVENTION

This invention relates to a controller, serial advanced technology attachment (SATA) system and method of operation therefor.

BACKGROUND OF THE INVENTION

Serial ATA (SATA or Serial Advanced Technology Attachment) is a computer bus interface designed for connecting host bus adaptors to mass storage devices, such as hard disk drives (HDD) and optical drives. A SATA protocol handshake process has been defined to communicate between one or more host(s) and one or more device(s). A SATA system controller is typically employed as a host processor that executes application software to communicate with a SATA IP Core and handle an upper layer SATA protocol. The SATA system controller may consist of host processor, DMA Engine, transmit (TX) first-in/first-out (FIFO) and receive (RX) FIFO.

FIG. 1 schematically shows a simplified SATA system 100. The SATA protocol is based on a transfer of information using Frame Information Structured (FIS) and control information (referred to as 'primitives') between a host comprising a number of host layers 105 and a device comprising a number of device layers 110. Primitives are primarily additional signalling messages used within a bus structure to start/stop/request a transfer of 'real' data. Primitives are often used amongst multiple data flows. Hosts and devices in a SATA system communicate via a high-speed serial cable over two pairs of conductors. As shown in FIG. 1, between the host layers 105 and device layers 110, the two pairs of conductors transfer application data 115 between applications, transport data 120 in a serial digital transport control format, link control data 125 in a serial digital link control format and physical data 130 across a serial physical interface.

The SATA protocol handshake process is known to be very structured and, hence, does not allow for any flexibility, particularly in handling errors within the primitive messages. It is known that errors may cause considerable loss of performance. It is known that at least two types of errors may occur in a SATA system.

A first type of SATA detected error includes protocol errors. Protocol errors include, for example, cyclic redundancy checking (CRC) errors or line noise that cause the SATA system to go into error handling routines (from which the SATA system may not recover) and/or protocol interpretation issues that may also cause the SATA system to go into error handling routines (from which it may recover).

A second type of SATA detected error may occur due to devices not supporting certain aspects of the SATA protocol and/or different hosts reacting differently to certain data transfer sequences, e.g. whereby a particular host may be prevented from using the SATA protocol. For example, a sequence of data transfers may be 'allowable' (sometimes referred to as 'legal') under the SATA protocol handshake process, but in a particular application the data transfer sequence may cause an adverse performance in the SATA system, for example by causing data transfers to stall (e.g. through multiple data transfer 'hold' operations), which may make an application fail.

A further example of potential problems may also result when an error primitive is detected, where the device starts an error routine based on the nature of the error, firmware it uses and/or the nature of the device itself. For example, if an error primitive is detected, some hard drives (HDD) may take several hundred milliseconds to recover and initialize the data transfer process. If the error re-occurs frequently, the SATA application may eventually become too slow and the application using it may cease to function effectively. In contrast, a solid state drive has other characteristics, such as it does not have moving, or mechanical parts. Hence, the access time with a solid state drive, as well as response time to an error, is very quick and the higher level application may suffer further. However, if the latency is long or the error occurs frequently, the application may be or become unusable.

U.S. Pat. No. 7,047,335B2 describes a device that is configured to detect SATA frames. Furthermore, and currently, some errors may be detected in the data transfer in a SATA system, but such errors are not correctable. U.S. Pat. No. 7,634,692B2 describes a SATA technique for avoiding certain types of errors, related to corrupted primitives only and correcting them using primitive prediction. In addition, U.S. Pat. No. 7,865,803B2 describes a SATA system whereby errors may be detected, and upon identification of an error in a SATA frame, the SATA handshake process is terminated early.

SUMMARY OF THE INVENTION

The present invention provides a controller, serial advanced technology attachment (SATA) system and method of operation therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 5 schematically shows an example state flow of an embodiment employed in a SATA protocol.

DETAILED DESCRIPTION

Because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Although the known art may suggest methods for avoiding certain types of errors, by performing analysis on a frame that contains a primitive sequence and data, detecting an error and correcting an error in the primitive sequence itself, there is no current proposed mechanism to ignore errors or the reporting of errors, disable performance limiting sequences, manipulate a sequence or adjust a host response according to the drive device, as described herein. Examples of the invention propose a hardware solution that can be integrated into an existing SATA design, for example by adapting an existing protocol state machine (sometimes referred to as host primitive controller). In some examples, a mechanism is provided to enable whole primitive sequences to be readily replaced and the primitive flow manipulated, thereby providing an opportunity to mark a frame as erroneous, or not, dependent upon the desired result. In some examples, the FIS related to the primitive sequence may be differentiated from the rest of the data flow. In some examples, the replacement of the whole primitive sequence with an allowable sequence may equate to correcting the sequence in error. In some examples, the error may be contained within the data, where the sequence may be legal but cause a slow response from the SATA drive. In some examples, a mechanism is provided to shorten primitives indicating idle time that may emanate from the host primitive controller, should they be determined as no longer being necessary. In some examples, a mechanism is provided to enable the SATA system to recover from previously unrecoverable errors, via replacement of at least one whole primitive sequence with one that does not create or contribute to the unrecoverable error.

Figure 1:
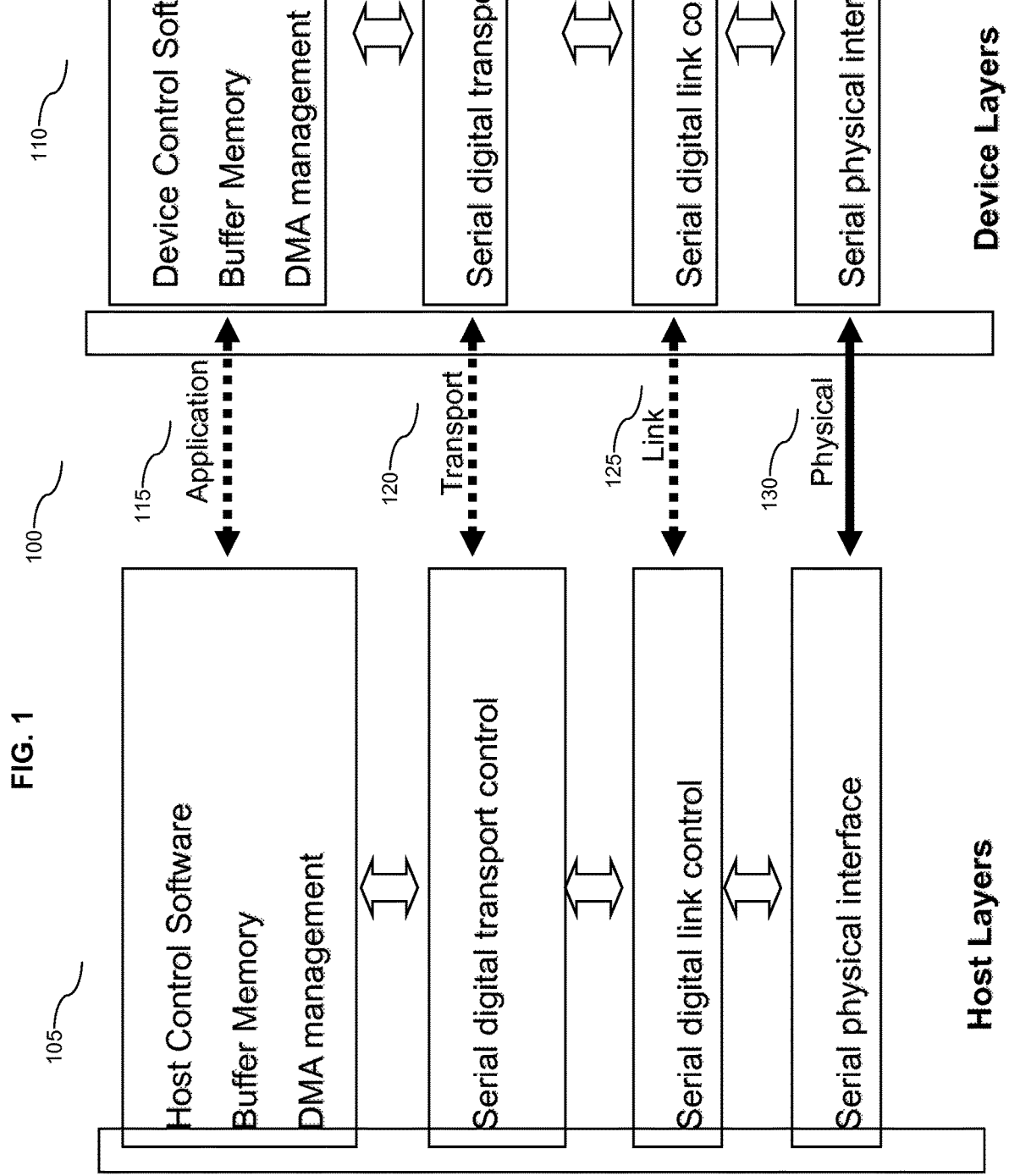
FIG. 1 schematically shows an example of an embodiment of a SATA protocol interface.
Figure 2:
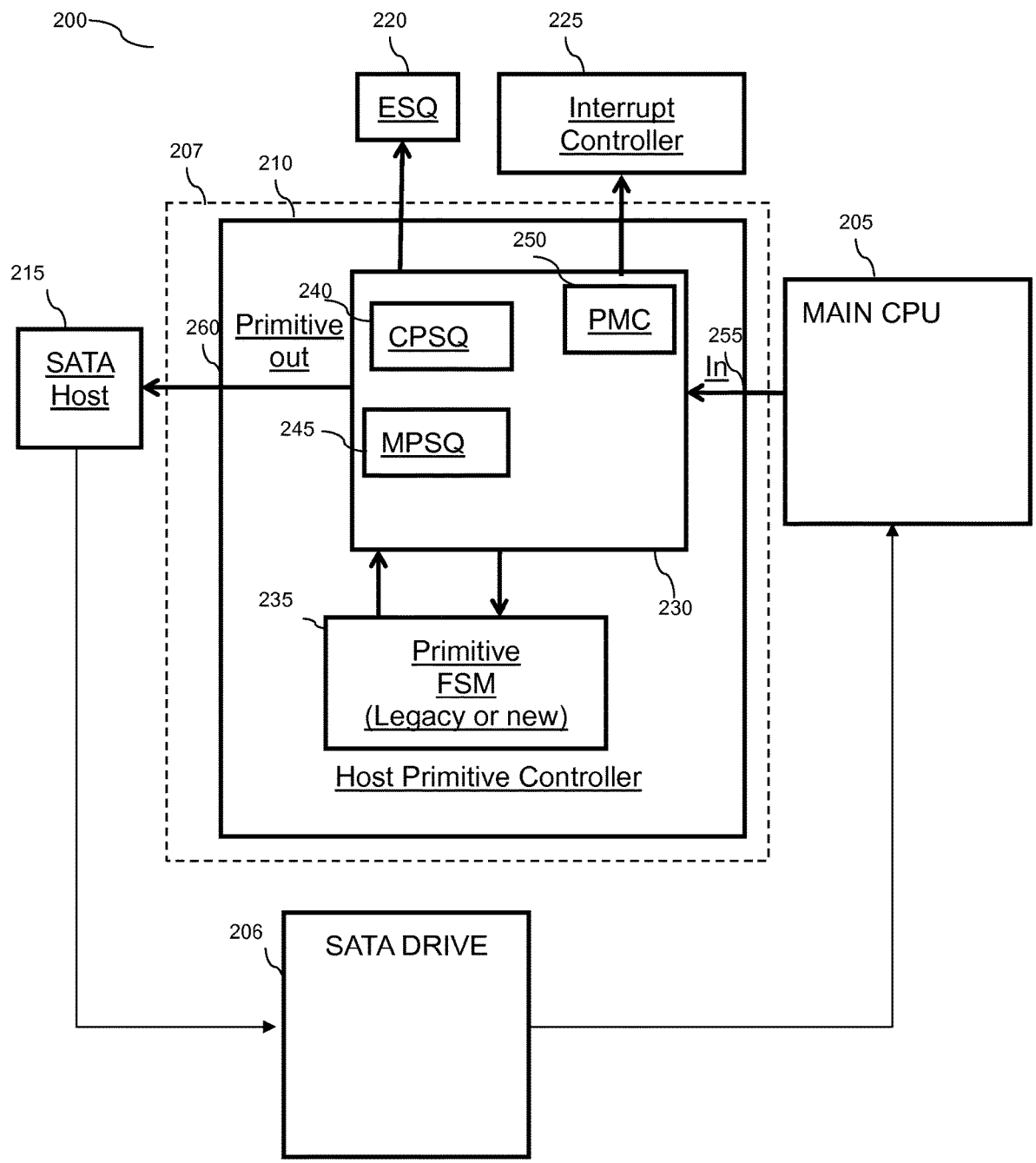
FIG. 2 schematically shows an example of an embodiment of a SATA state machine/host primitive controller adapted according to examples of the invention.

FIG. 2 schematically shows an example 200 of an embodiment of controller, which in one example is a SATA state machine/host primitive controller 210. In one example, the controller may reside within an integrated circuit 207, as shown, operably coupled to a SATA HOST central processing unit (CPU) 205. In some examples, the integrated circuit 207 may comprise the SATA HOST CPU 205. The SATA HOST central processing unit (CPU) 205 is configured to run software to access and configure the host primitive controller 210. The SATA HOST (main) CPU 205 takes data from a SATA drive 206, adds primitives/control information and provides the data together with the primitives to the SATA host primitive controller 210 via bus transactions. The SATA host primitive controller 210 analyses the data together with the primitives and sends the primitives to the SATA drive 206 via a SATA Host processor and interface 215

In the example shown, the SATA drive 206 is located on a separate IC or separate board, distal from the SATA host primitive controller 210. The SATA HOST CPU 205 also has an interface (not shown) that is configured to support various examples of the invention.

The drive and control data may comprise information on data availability from within the SATA drive 206 or SATA HOST (main) CPU 205. The host primitive controller 210 comprises a hardware processor 230 located so as to intercept data transfers from the SATA drive 206 or SATA HOST (main) CPU 205 to the SATA host processor and interface 215. In some examples, the hardware processor 230 may be implemented as a hardware accelerator where no firmware is involved. The hardware processor 230 is arranged to receive, from the SATA drive 206 through (main) SATA HOST CPU 205, the drive and control data. The hardware processor 230 is operably coupled via a bi-directional communication link to a primitive finite state machine (FSM) 235. In this manner, the input drive and control data may be analyzed by hardware processor 230 and control signals in the form of primitive messages generated in order to drive the primitive FSM 235, thereby affecting a control of the data flow. The primitive FSM 235 may be a legacy or newly configured FSM.

In this example, the hardware processor 230 comprises a Current Primitive Sequence Queue (CPSQ) module 240, a Modified Primitive Sequence Queue (MPSQ) module 245 and a Primitive Modification Control (PMC) module 250, each operably interconnected in some examples. Once activated, a user (for example a person configuring the controller via the SATA HOST (main) CPU interface (not shown) connected to host primitive controller 210 using higher level software) may be allowed to program the primitive sequence that needs modification in the Current Primitive Sequence Queue (CPSQ) module 240 and/or a desired primitive sequence in the modified Primitive sequence Queue (MPSQ) 245. In some examples, the CPSQ may be programmed up to and including the last primitive that will be replaced and that may not be transmitted back to the SATA drive 206 or SATA HOST CPU 205. In some examples, the last entry in the queue (either CPSQ or MPSQ) may be marked by a 'last entry' indication, such as a flag. The hardware processor 230 routes primitives sent by the SATA drive 206 or SATA HOST CPU 205, as well as other internal signals from within the host primitive controller 210, for example internal signals that may indicate a status of the host primitive controller 210 itself, to the SATA host processor and interface 215.

In some examples, the PMC module 250 compares the primitive FSM 235 output to the CPSQ module 240 and waits until the sequence is detected. The PMC module 250 uses the primitive FSM 235 as a mechanism to synchronize primitive transmissions, initializing the FSM after the sequence is over. Once the sequence in the CPSQ module 240 is detected, the PMC module 250 will take over transmission and will transmit the content of the MPSQ module 245. If the primitive FSM 235 and the sequence in the MPSQ module 245 are the same, the PMC module 250 will replace the primitives, but will not assert an interrupt and the two will work in unison.

In some examples, the PMC module 250 may have a masking register (not shown) that allows the masking of FSM inputs to allow this transition from the primitive FSM 235 being used to the sequence in the MPSQ module 245. In some examples, the masking may be performed once during the final stage of the modification, or in other examples the masking may be performed permanently.

In some examples, the PMC module 250 may also prepare an entry to the Exception Status Queue (ESQ) module 220, with information about the modified frame with the replaced primitive sequence in order to allow a software algorithm (not shown) in the SATA HOST (main) CPU 205 to treat it. The ESQ module 220 contains data for the software running on the SATA HOST (main) CPU 205 to know which frame is bad or in error. In some examples, the ESQ module 220 may be a simple interrupt Queue configured as a reporting medium. In some examples, the ESQ module 220 may be an integrated circuit located inside the host primitive controller 210 or external to the host primitive controller 210 and operably coupled thereto.

In addition to the hardware processor 230 routing drive and control data from the SATA drive 205 to the SATA host 215, for example host transmitter circuitry, and communicating with the primitive FSM 235, the hardware processor 230 comprises additional outputs to an interrupt controller 225 as well as the ESQ module 220. In some examples, the ESQ module 220 may be implemented as an interrupt table, for example in a form of a random access memory (RAM) that samples interrupts created (e.g. written) by the PMC module 250 and stores the interrupts with their relevant data. In some examples, every line of data may contain an exception. The interrupts in the ESQ module 220/RAM may be cleared by software. In some examples, the entry to the ESQ module 220 may include an identification of a location within the SATA drive 206 of the SATA data being affected. Once an entry is written into the ESQ module 220, the interrupt controller 225 is notified and the SATA HOST (main) CPU 205 clears the interrupt and reads the ESQ module 220, providing its information to the software for corrections.

In accordance with some examples, when an error or performance-wise non-allowable data sequence is generated by the host primitive controller 210 and provided to the SATA Host processor and interface 215 and ultimately to the SATA drive 206, it causes the SATA drive 206 to commence error handling routines or alternatively some other routines if it does not recognize the data sequence. In known SATA systems, the recognition of data sequences by such error handling routines will inevitably cause a delay. Thus, in accordance with some examples, a user evaluating the system is able to detect any error if an indication of a commencement of an error handling routine is provided to an output (not shown) or relayed to the user in some other manner. Once an error is detected, perhaps in the primitive itself but more particularly if the error is determined as being in the sequence itself, the hardware processor 230 causes the host primitive controller 210 to divert the detected sequence and the handling of the sequence, e.g. correction thereof, to any associated software, thus making the system usable and reliable again. In some examples, the sequence determined as being in error may indicate that an error has occurred somewhere in the SATA system. In some examples, the sequence determined as being in error may be an error primitive that is typically understood to be a legal (allowable) sequence or legal (allowable) primitive, but one that may not be sent due to system considerations. In some examples, the handling or correction of the sequence may comprise replacing an allowable sequence that a user may decide is no longer needed, in order to improve the SATA system performance. In this manner, in some examples, the error handling of the present invention differs from known SATA error handling techniques that are solely able to handle illegal (unallowable) primitives that have been corrupted, say, due to noise or poor reception of data.

For example, and as shown, a modified SATA state machine/host primitive controller may be inserted into a data path that may be subject to a number of errors, for example a system or device working under extreme operating conditions. In one application, the data being read may be video or audio data that is not sensitive to such errors. In this manner, a user may decide to eliminate the error by incorporating the example SATA state machine/host primitive controller into the data stream. The ability to detect and divert detected errors from the data stream passing through the host primitive controller 210 may allow the system/device employing the application to become usable again, or improve performance. In some examples, such a hardware solution may be adopted on a per-application basis, based on the nature of the application. Advantageously, the insertion of such a modified SATA state machine/host primitive controller hardware into the data stream may enable an increase in performance through better error handling with no loss in 'timing' performance since the process is automated.

Figure 3:
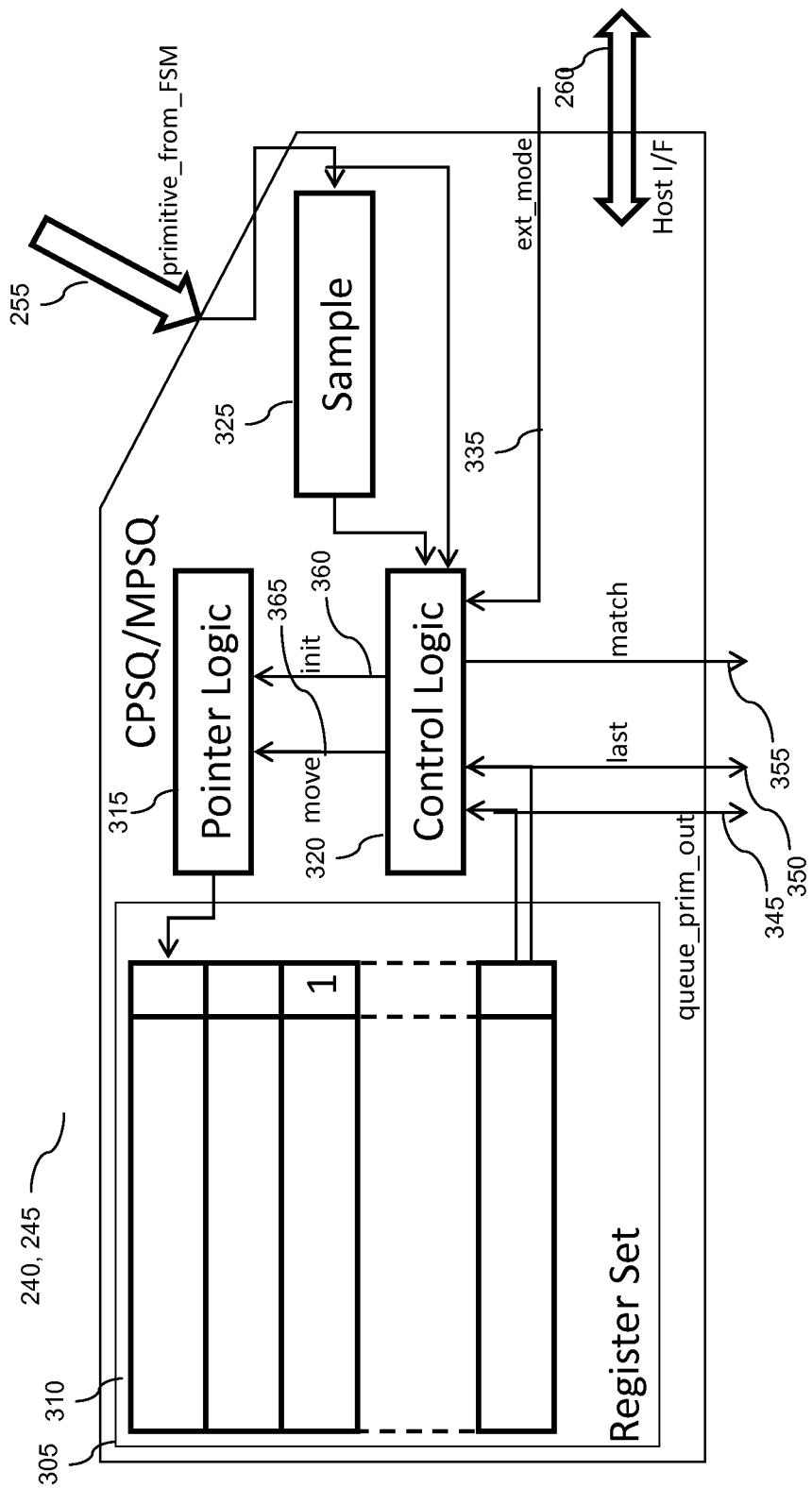
FIG. 3 schematically shows a hardware example of an embodiment of a SATA Primitive Sequence Queue.

Referring now to FIG. 3, a hardware example of an embodiment of a SATA Primitive Sequence Queue module 240, 245 is schematically shown. The SATA Primitive Sequence Queue 240, 245 in FIG. 3 may be configured to function as a CPSQ module 240 or a MPSQ module 245, the modules predominantly comprise the same entities and operations, other than in some of the examples described herein one input differs and then this input affects their logical operation. In some examples, the CPSQ module 240 may hold a sequence of primitives that the user does not wish to send, and the MPSQ module 245 may hold the replacement sequence.

The CPSQ module 240/MPSQ module 245 comprises a register set 305 that comprises a series of memory elements 310. The register set 305 is operably coupled to pointer logic 315 and controller unit 320. In operation, a series of data primitives 255 are received from, say, primitive FSM 235 of FIG. 2, and input to a sampling function 325. The sampled data (output from sampling function 325) as well as the non-sampled data primitive 255 are input into controller unit 320. The operation of controller unit 320, for example as to whether it functions as a CPSQ module 240 or a MPSQ module 245, is controlled by an external mode (EXT_MODE) pin/input 335 that receives a control signal from an appropriate software processor.

In a CPSQ module 240, the EXT_MODE) pin/input 335 is set to a logical '0'. In a MPSQ module 245, the EXT_MODE) pin/input 335 is set to: 'EXT_MODE= (PSM_STATE==REPLACE) & primitive_fsm_advance condition'. In some examples, in the CPSQ module 240, the move condition may be based solely on an advancement of the primitive FSM, since it is conditioned to follow the advancement. In the MPSQ module 245, the advancement may be conditioned if the FSM 235 reaches a state that requires sequence replacement(s), in which case the MPSQ module 245 will be moved forward, thereby overriding the regular FSM output.

The controller unit 320, under instruction from the EXT_MODE pin/input 335, controls the address in register set 305 that the pointer logic 315 points to. An initial address for the pointer logic 315 to access is set by an initialising signal 'init' 360. The pointer is subsequently moved amongst the register addresses using a 'move' signal 365. The 'move' signal 365 causes the register set pointer to advance to the next data entry in memory elements 310 within the register set 305. The controller unit 320 receives an input of the data entry being pointed to via a 'queue_prim_out' signal 345.

The controller unit 320 compares the sample primitive data from the FSM with the data entry being pointed to via a 'queue_prim_out' signal 345, and determines whether there is a match 355 or an error. If there is a match, i.e. 'sample==Queue_prim_out', then a match signal or bit is set 355. If there is not a match, and an error is determined, the controller unit 320 moves the register set pointer to advance to the next data entry in memory elements 310 within the register set 305, using for example, the notation:
Move=((sample==queue_prim_out) & !last & (primitive_from_fsm!=sample))|EXT_MODE The 'move' operation in the above code is configured to detect a change. As shown in this example code, a 'move' operation occurs, for example in the CPSQ module 240 or MPSQ module 245, if any of the following conditions exist:

1. A received primitive sequence sample and the primitive sequence output from the CPSQ module 240 or MPSQ module 245 are equal;
2. A received primitive sequence sample holds an old primitive sequence (e.g. the sample does not match the primitive coming out of the primitive FSM 235);
3. The sample is not the last sample (identified as !last); and
4. The EXT_MODE pin/input 335 is configured so as to differentiate between use of a CPSQ primitive sequence and a MPSQ primitive sequence. The CPSQ module 240 advances when there is no match between the CPSQ primitive sequence and the primitive FSM 235. The MPSQ module 245 advances when the PMC is in a 'replace' operational mode and the primitive FSM 235 has advanced.

Figure 4:
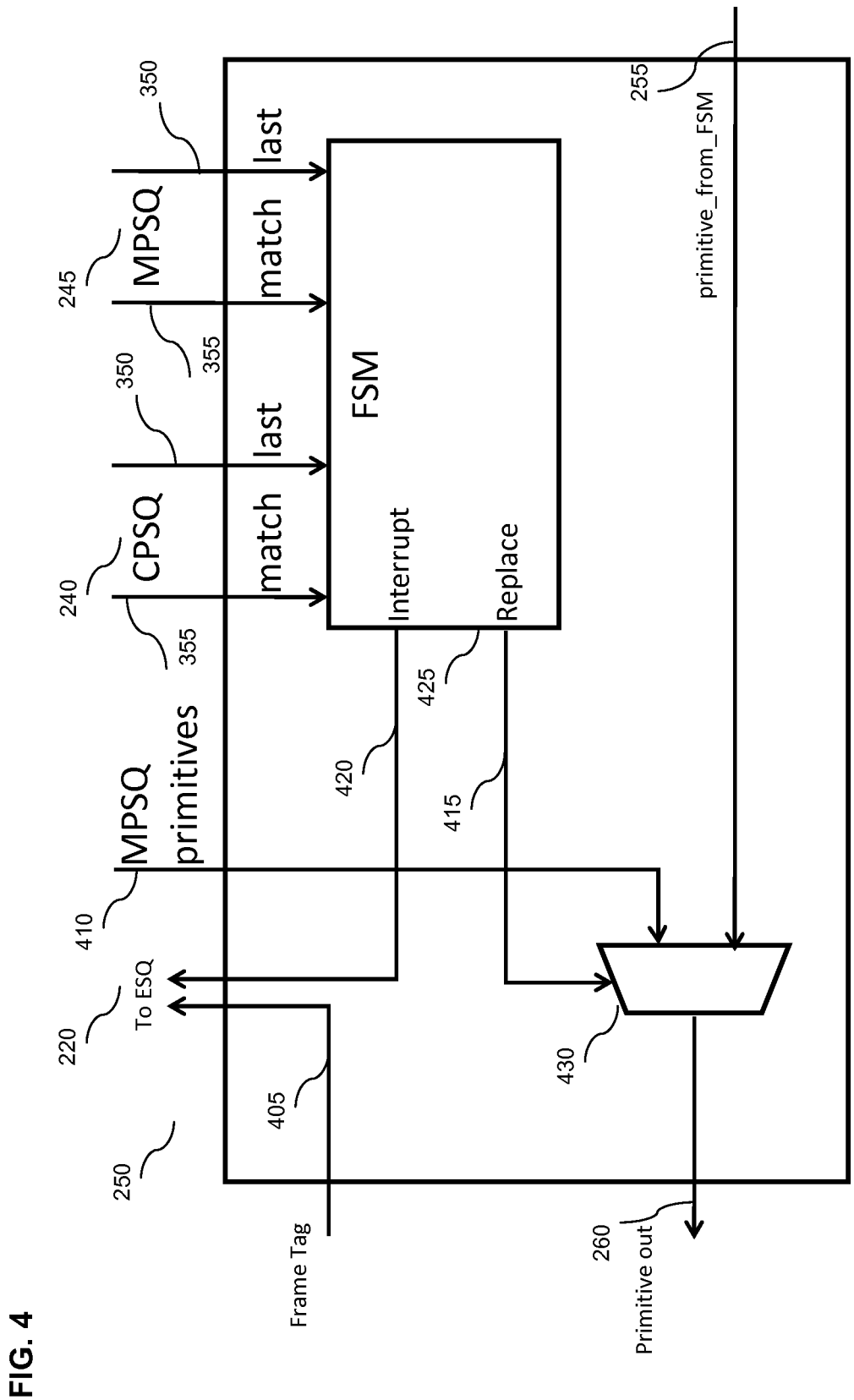
FIG. 4 schematically shows a hardware example of an embodiment of a SATA Primitive Modification Control module.

Referring now to FIG. 4 a hardware example of an embodiment of a SATA Primitive Modification Control (PMC) module 250 is schematically shown. In accordance with some examples, the PMC module 250 functions as a controller for the whole SATA operation. The SATA Primitive Modification Control (PMC) module 250 receives primitives 255 from a host primitive controller, such as host primitive controller 210 of FIG. 2. In a normal error-free operational mode, primitive sequences 255 from the host primitive controller are passed through switch element 430, which either routes signal 255 or MPSQ primitive 410, dependent upon the replace-control signal 415 and the primitive sequences are output via interface 260 from the PMC module 250.

In accordance with some examples, the PMC module 250 may comprise a frame tag input 405, which functions as a frame identifier and may include control information (such as a frame counter, a timer or other information). The frame identifier enables upper level software to identify a particular data frame that is being modified and provide an opportunity to apply special attention to the sequence. In some examples, the frame tag input 405 may also be provided to the ESQ module 220, as shown. In some examples, the frame identifier may enable the PMC module 250 to equate the frame comprising the error with an absolute frame reference, thereby making it easier to monitor the process in the upper level software.

In accordance with examples, the PMC module 250 comprises a PMC finite state machine 425 that is configured to check and replace the primitive sequence (if necessary) and may be arranged to generate an error if a sequence replacement has occurred.

In some examples, the whole SATA operation may be activated using a mode bit (not shown), providing a user with an option to implement the error detection and replacement function as deemed fit. In some examples, the mode bit may reside in the PMC finite state machine 425, for example in a memory mapped register, which is accessible using the SATA host interface by the software.

In some examples, the use of a mode bit may enable the host primitive controller/state machine 210. In some examples, if the host primitive controller/state machine 210 is enabled by the mode bit and the MPSQ module 245 has replaced a sequence that is different from the primitive provided by primitive FSM 235, an interrupt signal 420 will be initiated. The interrupt signal 420 will cause the ESQ module, for example ESQ module 220 of FIG. 2, to sample the respective frame information identified in frame tag 405 and revert to the interrupt controller, for example interrupt controller 225 of FIG. 2, in order to flag the frame to the higher level software running on the SATA HOST (main) CPU 205.

In some examples, the mode bit may be operably coupled to a clock generator (not shown) of the host primitive controller/state machine 210 and configured to prevent a clock signal being provided to the hardware processor 230; thus conserving power. In this case, selector 430 is arranged to also choose the primitive 235 that is not affected and is to replace the primitive sequence in error or the primitive sequence limiting the SATA system performance. In accordance with FIG. 3, the PMC finite state machine 425 receives a match signal 355 and an indication of the last data element 350 from both the CPSQ module 240 and the MPSQ module 245.

FIG. 5 schematically shows an example state flow 500 of an embodiment employed, for example, in PMC finite state machine 425. The example state flow 500 typically operates in a 'pass through' mode state 505, looping with each primitive sample of FIS information, as shown in 510. The primitive sample of FIS information loop occurs when there is not a CPSQ match of data and it is not the last CPSQ (queued) primitive sequence. When there is a CPSQ match of the primitive sequence with the sample (and it is not the last CPSQ (queued) primitive sequence) in 515, a check is performed to see if a match has occurred in state 520. The example state flow 500 remains in this 'check' state 520 whilst there is a CPSQ match of the primitive sequence with the sample and it is not the last CPSQ (queued) primitive, as in 525.

If it is determined in 'check' state 520 that an error does not exist, and there is not a CPSQ match of the primitive sequence with the sample and it is not the last CPSQ (queued) data frame, then the example state flow 500 loops back in 530 to the 'pass through' mode state 505. However, if it is determined in 'check' state 520 that an error does exist, and there is a CPSQ match of the primitive sequence with the sample and it is the last CPSQ (queued) data in 535, then the example state flow 500 transitions to a data frame 'replace' state 540. The example state flow 500 continues to replace the data frame in the FIS whilst the data frame is not the last MPSQ (queued) data frame, as in 545. When it is determined that the data frame is the last MPSQ (queued) data frame, as in 550, the example state flow 500 transitions back to the 'pass through' mode state 505.

Thus, a controller, a method of operation and an interface comprising such a controller have been described, for example a controller that adds a capability to control the flow of information between, say, a SATA drive and SATA host, whereby there is a potential for an increase in performance, particularly in a scenario where there are repetitive error primitives. In some examples, a controller, a method of operation and an interface comprising such a controller have been described whereby there may be a prevention of performance limiting sequences. In some examples, a controller, a method of operation and an interface comprising such a controller have been described whereby software intervention, for example software arranged to modify the FIS, is allowed in the primitive process. In some examples, a controller, a method of operation and an interface comprising such a controller have been described whereby a flexible design may be implemented in a data system, such as a SATA system, which can be modified to suit various applications and/or a system comprising multiple devices. In some examples, a controller, a method of operation and an interface comprising such a controller have been described, for example a controller that adds a capability to control the flow of information between, say, a SATA drive and SATA host, whereby the existence of data flows that decrease performance are removed, thereby allowing the host to mask errors it can recover from, thus preventing the drive from initiating undesired sequences The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.), digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality. For example, the functions of the hardware processor 230 may be implemented in hardware. In other examples, the CPSQ module 240 and MPSQ module 245 may be implemented in some embodiments within a single module. In other examples, the PMC module 250 may be also implemented within a CPSQ module 240 and MPSQ module 245 or external to the hardware processor 230.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit, such as an implementation that included ESQ module 220 and/or interrupt controller 225 within integrated circuit 207 of FIG. 2, or within a same device. Alternatively, the examples may be implemented as any number of separate integrated circuits, such as integrated circuit 207 of FIG. 2, with separate integrated circuits for ESQ module 220 and/or interrupt controller 225 or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A controller for operably coupling a drive unit to a host unit in a serial advanced technology attachment (SATA) system, wherein the controller comprises a hardware processor arranged to:
   receive a plurality of SATA data frames;
   determine that a sequence of primitives in at least one of the plurality of SATA data frames matches a first primitive sequence stored at a register, the sequence of primitives received without errors and including more than one primitive, wherein the first primitive sequence adversely affects a data transfer performance of the SATA system; and
   replace the sequence of primitives with a second primitive sequence to improve the data transfer performance of the SATA system relative to the first primitive sequence.

2. The controller of claim 1 further comprising at least one primitive sequence queue module operably coupled to the hardware processor and arranged to provide the second primitive sequence to replace the first primitive sequence.

3. The controller of claim 1 wherein the controller further comprises a Primitive Modification Control (PMC) module operably coupled to the hardware processor and arranged to compare a primitive message of at least one SATA data frame with stored primitive data.

4. The controller of claim 3 wherein the PMC module is arranged to compare as a first input a primitive sequence from the plurality of SATA data frames with a second input of a primitive sequence output from a current primitive sequence queue (CPSQ) module and assume responsibility in outputting a transmission from the controller in response to detecting a match of said first input and said second input.

5. The controller of claim 4, wherein the PMC module is operably coupled to a modified primitive sequence queue (MPSQ) module and arranged to output a primitive sequence from the MPSQ module in response to detecting the match.

6. The controller of claim 5, wherein the PMC module is arranged to prepare an entry to an Exception Status Queue (ESQ) module coupled thereto, with information about the primitive sequence from the MPSQ module.

7. The controller of claim 4, wherein the PMC module comprises a masking register for masking a transition from outputting the received plurality of SATA data frames to outputting the second primitive sequence.

8. The controller of claim 4, wherein a last entry in the current primitive sequence queue comprises a 'last entry' indicator.

9. The controller of claim 3, wherein the PMC module comprises a frame tag input that functions as a frame identifier and includes control information.

10. The controller of claim 1 wherein the hardware processor identifies the first primitive sequence that adversely affects a performance of the SATA system by detecting an error or performance limiting event in at least one of: the primitive or primitive sequence.

11. The controller of claim 10, wherein in response to detecting an error or performance limiting event the hardware processor diverts the sequence comprising the primitive or primitive sequence in error to a software processor for handling of the sequence.

12. The controller of claim 1, wherein the hardware processor is arranged to replace the sequence of primitives with the second primitive sequence in response to a mode bit being activated.

13. A serial advanced technology attachment (SATA) system comprising the controller of claim 1.

14. The controller of claim 1, wherein:
   the register comprises a programmable current primitive sequence queue (CPSQ) configured to store the first primitive sequence that needs modification; and
   wherein the hardware processor comprises:
   a programmable modified primitive sequence queue (MPSQ) configured to store the second primitive sequence to replace the sequence of primitives; and
   a primitive modification controller (PMC) configured to transmit the second primitive sequence from the MPSQ in response to detecting the sequence of primitives in the at least one of the plurality of SATA data frames matches the first primitive sequence stored at the CPSQ.

15. The controller of claim 1, wherein the sequence of primitives in the at least one of the plurality of SATA data frames is replaced in its entirety with the second primitive sequence.

16. A method of performance improvement in a serial advanced technology attachment (SATA) system, the method comprising:
   receiving a plurality of SATA data frames including a sequence of primitives received without errors;
   determining that the sequence of primitives matches a first primitive sequence that adversely affects a data transfer performance of the SATA system, the first primitive sequence stored at a register and including more than one primitive; and
   replacing the sequence of primitives with a second primitive sequence to improve the data transfer performance of the SATA system relative to the first primitive sequence.

17. The method of claim 16, further comprising:
storing the first primitive sequence at a programmable current primitive sequence queue (CPSQ), to specify the sequence of primitives that needs modification; and
storing the second primitive sequence at a programmable modified primitive sequence queue (MPSQ).

18. The method of claim 16, wherein the sequence of primitives in the at least one of the plurality of SATA data frames is replaced in its entirety with the second primitive sequence.

19. A non-transitory computer program product comprising executable program code stored therein for performance improvement in a serial advanced technology attachment (SATA) system, the program code comprising instructions operable for performing the method comprising:
receiving a plurality of SATA data frames including a sequence of primitives received without errors;
determining that the sequence of primitives matches a first primitive sequence that adversely affects a data transfer performance of the SATA system, the first primitive sequence stored at a register and including more than one primitive; and
replacing the sequence of primitives with a second primitive sequence to improve the data transfer performance of the SATA system relative to the first primitive sequence.

20. The non-transitory computer program product of claim 19, further comprising instructions to:
store the first primitive sequence at a programmable current primitive sequence queue (CPSQ), to specify the sequence of primitives that needs modification; and
store the second primitive sequence at a programmable modified primitive sequence queue (MPSQ).

* * * * *